United States Patent
Koizumi

(10) Patent No.: US 8,543,355 B2
(45) Date of Patent: Sep. 24, 2013

(54) SUBSTRATE PROCESSING APPARATUS CHECKING METHOD AND STORAGE MEDIUM

(75) Inventor: Tomoya Koizumi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 698 days.

(21) Appl. No.: 12/241,291

(22) Filed: Sep. 30, 2008

(65) Prior Publication Data

US 2009/0125276 A1 May 14, 2009

Related U.S. Application Data

(60) Provisional application No. 61/017,420, filed on Dec. 28, 2007.

(30) Foreign Application Priority Data

Oct. 4, 2007 (JP) .................................. 2007-261006

(51) Int. Cl.
*G06F 15/00* (2006.01)

(52) U.S. Cl.
USPC ............................................ 702/182; 702/81

(58) Field of Classification Search
USPC ....................... 702/182, 81, 84; 700/108, 109
See application file for complete search history.

(56) References Cited

U.S. PATENT DOCUMENTS

| | | | |
|---|---|---|---|
| 6,954,716 B2 * | 10/2005 | Tanaka et al. | 702/184 |
| 7,113,838 B2 * | 9/2006 | Funk et al. | 700/108 |
| 7,376,479 B2 * | 5/2008 | Tanaka et al. | 700/108 |

FOREIGN PATENT DOCUMENTS

| | | |
|---|---|---|
| JP | 2000-269108 | 9/2000 |
| JP | 2002-25878 | 1/2002 |
| JP | 2004-47501 | 2/2004 |
| JP | 2004-318273 A | 11/2004 |
| JP | 2007-40457 | 2/2007 |

OTHER PUBLICATIONS

Office Action mailed Dec. 25, 2012, in Japanese Patent Application No. 2007-261006, filed Oct. 4, 2007.

* cited by examiner

*Primary Examiner* — Manuel L Barbee
(74) *Attorney, Agent, or Firm* — Oblon, Spivak, McClelland, Maier & Neustadt, L.L.P.

(57) ABSTRACT

A substrate processing apparatus checking method that can simply and reliably check the transient response characteristics of a substrate processing apparatus. An analyzing apparatus reads and analyzes process data comprised of time-series data on a plurality of parameters relating to a process comprised of a plurality of steps carried out on a substrate by the substrate processing apparatus. The analyzing apparatus extracts data that satisfies predetermined extracting conditions from the process data, and analyzes the extracted data based on predetermined analyzing conditions.

13 Claims, 8 Drawing Sheets

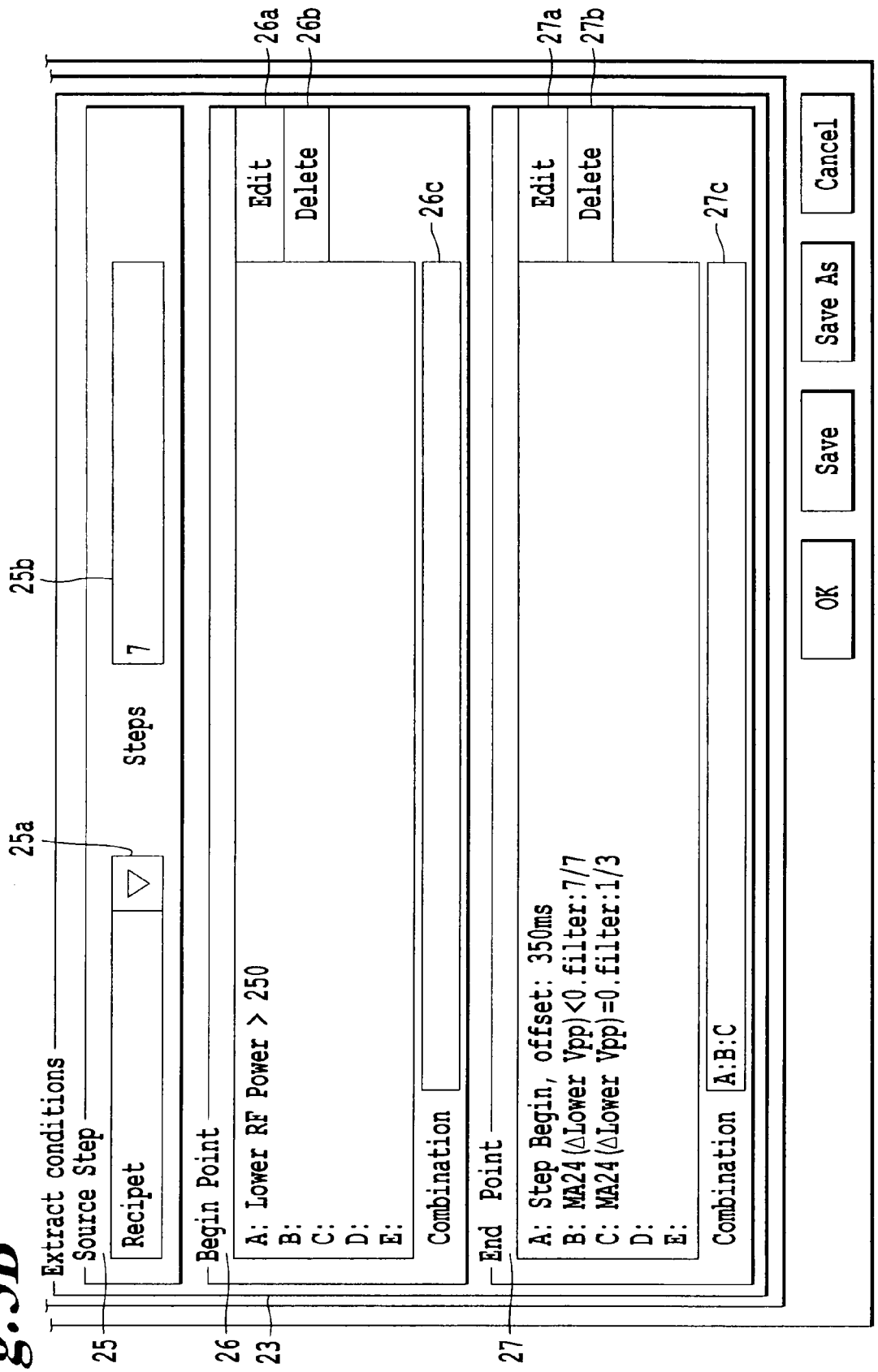

Fig.5

EEQM Analyze Assist Tool: RF Run Point Condition — 28

Condition — 29

- V> x
- V>=x
- V< x
- V<=x
- V= x
- StepEdge
- StepBegin offset [0] ms — 29a filter [7] / [7] — 29b Value x [0] — 29c

V setting — 30

Parameter:
- Gas (5) Flow
- Gas (6) Flow
- Gas (7) Flow
- Gas (8) Flow
- Gas (9) Flow
- IC Position
- Imp. Jx (Lower)
- Imp. Jx (Upper)
- Imp. Jx (Lower)
- Imp. Jx (Upper)
- Lower C1 Position
- Lower C2 Position
- Lower Cool Flow Rate
- Lower RF Power
- Lower RF Reflect Power
- Lower Vpp Parameter Process $V = F3(F2(F1(Parameter)))$ F1 [△] — 30a
Value z [0] — 30b F2 [Moving Average (Zone z)] — 30a
Value z [24] — 30b F3 [ ] — 30a
Value z [0] — 30b

[OK] [Cancel]

Fig. 7

| FUNCTION NAME | STEP TYPE | STEP NUMBER | FIRST TIME | LAST TIME | PARAMETER NAME | ANALYSIS VALUE | UNIT |
|---|---|---|---|---|---|---|---|
| 07.LOWER C1 POSITION (STABILITY TIME)-IMMEDIATLY AFTER IGNITION | 01 RECIPE | 7 | 15:40.5 | 15:41.5 | PERIOD (LOWER C1 POSITION) | 1 | SEC |
| 07.LOWER C2 POSITION (STABILITY TIME)-IMMEDIATLY AFTER IGNITION | 01 RECIPE | 7 | 15:40.5 | 15:41.5 | PERIOD (LOWER C2 POSITION) | 1 | SEC |
| 07.UPPER C1 POSITION (STABILITY TIME)-IMMEDIATLY AFTER IGNITION | 01 RECIPE | 7 | 15:40.5 | 15:41.1 | PERIOD (UPPER C1 POSITION) | 0.6 | SEC |
| 07.UPPER C2 POSITION (STABILITY TIME)-IMMEDIATLY AFTER IGNITION | 01 RECIPE | 7 | 15:40.5 | 15:41.9 | PERIOD (UPPER C2 POSITION) | 1.4 | SEC |
| 09.UPPER RF REFLECT POWER (STABILITY TIME)-IMMEDIATLY AFTER IGNITION | 01 RECIPE | 5 | 15:40.0 | 15:40.0 | PERIOD (UPPER RF POSITION) | 0 | SEC |
| 09.UPPER RF REFLECT POWER (STABILITY TIME)-IMMEDIATLY AFTER IGNITION | 01 RECIPE | 6 | 15:40.0 | 15:40.2 | PERIOD (UPPER RF POSITION) | 0.2 | SEC |
| 09.UPPER RF REFLECT POWER (STABILITY TIME)-IMMEDIATLY AFTER IGNITION | 01 RECIPE | 7 | 15:40.3 | 15:40.3 | PERIOD (UPPER RF POSITION) | 0 | SEC |
| 09.UPPER RF REFLECT POWER (STABILITY TIME)-IMMEDIATLY AFTER IGNITION | 01 RECIPE | 7 | 15:40.3 | 15:40.9 | PERIOD (UPPER RF POSITION) | 0.6 | SEC |

SUBSTRATE PROCESSING APPARATUS CHECKING METHOD AND STORAGE MEDIUM

BACKGROUND OF THE INVENTION

1. Field of the Invention

The present invention relates to a substrate processing apparatus checking method and a storage medium, and more particularly to a method of checking a substrate processing apparatus using time-series data on parameters relating to processing carried out on substrates by the substrate processing apparatus.

2. Description of the Related Art

A substrate processing apparatus such as an etching apparatus or a CVD apparatus is manufactured by an apparatus manufacturing company (manufacturer), then disassembled once and delivered to an apparatus using company (customer), and further assembled by the apparatus using company. In general, it is necessary for the apparatus manufacturing company to assure the quality of the substrate processing apparatus, and for quality assurance, it is necessary to prove that the performance of the delivered and assembled substrate processing apparatus is the same as or rarely different from the as-manufactured performance of the substrate processing apparatus. In the case that a plurality of substrate processing apparatuses of the same model are delivered, it is necessary for the apparatus manufacturing company to prove that there is no little difference in performance between the substrate processing apparatuses.

To prove such things, a substrate processing apparatus delivered and assembled is operated once to carry out processing on substrates, time-series data on parameters relating to the processing is sampled, and the substrate processing apparatus is checked using the sampled data.

As such a checking method, there is known a method in which the emission intensity of plasma in plasma processing on wafers is sampled as operation data, and multivariable analysis (mainly, principal component analysis) is carried out using the operation data to detect abnormalities in the apparatus (see e.g. Japanese Laid-Open Patent Publication (Kokai) No. 2004-47501).

In recent years, with miniaturization of semiconductor devices manufactured from wafers, the transient response characteristics of the apparatus (for example, the time from when the application of radio-frequency voltage from a lower electrode of the apparatus is started until when the applied radio-frequency voltage becomes stable) is required to be additionally managed, and hence the transient response characteristics of the apparatus as well are required to be checked.

On the other hand, in the above described checking method, because multivariable analysis is carried out, the effects of operation data throughout the whole period of plasma processing are reflected on obtained checking results, and transient data changes cannot be checked.

To cope with this, there is known a method in which time-series data on parameters relating to plasma processing throughout the whole period of plasma processing as a reference is set as a set value pattern, and in plasma processing carried out by a substrate processing apparatus, time-series data on parameters relating to the plasma processing is sampled and set as a measured value pattern, and the set value pattern and the measured value pattern are directly compared with each other (see e.g. Japanese Laid-Open Patent Publication (Kokai) No. 2000-269108). In this method, because statistical processing such as multivariable analysis is not performed on data to be compared, transient data changes (transient response characteristics) can be checked.

However, the set value pattern described above is time-series data throughout the whole period of the plasma processing, setting the set value pattern takes much time and effort, and comparison between the set value pattern and the measured value pattern puts a heavy load on a PC or the like.

From the viewpoint of reducing man-hour for comparison, part of the set value pattern and part of the measured value pattern are sometimes compared with each other, but extraction (narrowing), comparison, etc. of data from the set value pattern and so on are manually carried out by an operator, which causes human errors and lowers the reliability of checking of transient response characteristics. Further, there are many situations where a simple analyzing process is manually carried out on data extracted at the time of comparison, but in such situations, it is necessary to define the contents of the analyzing process (define macros and calculation formulas using spreadsheet software) as occasion demands, and as a result, it takes much time to check transient response characteristics.

SUMMARY OF THE INVENTION

The present invention provides a substrate processing apparatus checking method and a storage medium that can easily and reliably check the transient response characteristics of the substrate processing apparatus.

The first aspect of the present invention can provide a method of checking a substrate processing apparatus in a system comprising at least one substrate processing apparatus and an analyzing apparatus that reads and analyzes process data comprising time-series data on a plurality of parameters relating to a process comprising a plurality of steps carried out on a substrate by the substrate processing apparatus, comprising a data extracting step in which the analyzing apparatus extracts data that satisfies predetermined extracting conditions from the process data, and a data analyzing step in which the analyzing apparatus analyzes the extracted data based on predetermined analyzing conditions.

According to the first aspect of the present invention, because the analyzing apparatus extracts data that satisfies predetermined extracting conditions from the process data comprising time-series data on a plurality of parameters relating to a process comprising a plurality of steps carried out on the substrate, and further, the analyzing apparatus analyzes the extracted data based on predetermined analyzing conditions, it is unnecessary for an operator to manually carry out data extraction and data analysis. Moreover, the effects of extracted data are mainly reflected on the result of analysis of the extracted data, and hence, if data relating to transient response characteristics is extracted, the transient response characteristics of the substrate processing apparatus can be easily and reliably checked.

The first aspect of the present invention can provide a method of checking a substrate processing apparatus comprising a data dividing step of, prior to the data extracting step, dividing the process data into data corresponding to the steps based on event data indicative of starting points and ending points of the respective steps in the process.

According to the first aspect of the present invention, because prior to the data extracting step, the process data is divided into data corresponding to the steps based on event data indicative of starting points and ending points of the respective steps in the process, data to be extracted which satisfies predetermined extracting conditions can be decreased, and hence the transient response characteristics of the substrate processing apparatus can be checked more easily.

The first aspect of the present invention can provide a method of checking a substrate processing apparatus, wherein the system further comprises a data storage apparatus, and the data storage apparatus stores the process data and the event data.

According to the first aspect of the present invention, because the data storage apparatus stores the process data and the event data, the event data can be immediately referred to when the process data is divided, and thus the process data can be smoothly divided.

The first aspect of the present invention can provide a method of checking a substrate processing apparatus, wherein the analyzing apparatus carries out the data dividing step, the data extracting step, and the data analyzing step in reading the process data from the data storage apparatus.

According to the first aspect of the present invention, because the analyzing apparatus carries out the data dividing step, the data extracting step, and the data analyzing step in reading the process data from the data storage apparatus, the operator can use the result of data analysis immediately after the analyzing apparatus reads the process data, and hence the checking efficiency can be improved.

The first aspect of the present invention can provide a method of checking a substrate processing apparatus, wherein the predetermined extracting conditions and the predetermined analyzing conditions are set before the process data is read by the analyzing apparatus.

According to the first aspect of the present invention, because the predetermined extracting conditions and the predetermined analyzing conditions are set before the process data is read by the analyzing apparatus, the data extracting step and the data analyzing step can be carried out immediately when the process data is read, and as a result, the checking efficiency can be more improved.

The first aspect of the present invention can provide a method of checking a substrate processing apparatus, wherein the analyzing apparatus comprises a display section displaying a GUI, and the predetermined extracting conditions and the predetermined analyzing conditions are set via the GUI.

According to the first aspect of the present invention, because the predetermined extracting conditions and the predetermined analyzing conditions are set via the GUI of the analyzing apparatus, the predetermined extracting conditions and the predetermined analyzing conditions can be easily set, and as a result, the checking efficiency can be further improved.

The first aspect of the present invention can provide a method of checking a substrate processing apparatus, wherein the GUI provides at least a difference calculation formula, an absolute value calculation formula, and a moving average calculation formula as calculation formulas that can be used in setting the predetermined extracting conditions.

According to the first aspect of the present invention, because the GUI provides at least the difference calculation formula, the absolute value calculation formula, and the moving average calculation formula as calculation formulas that can be used in setting the predetermined extracting conditions, the predetermined extracting conditions can be efficiently set.

The first aspect of the present invention can provide a method of checking a substrate processing apparatus, wherein the GUI provides at least an average calculation formula, a maximum value calculation formula, a minimum value calculation formula, a standard deviation calculation formula, a first value calculation formula, a last value calculation formula, an analysis range period calculation formula, an approximate linear slope calculation formula, a linear regression intercept calculation formula, and a correlation coefficient calculation formula as calculation formulas that can be used in setting the predetermined analyzing conditions.

According to the first aspect of the present invention, because the GUI provides at least the average calculation formula, the maximum value calculation formula, the minimum value calculation formula, the standard deviation calculation formula, the first value calculation formula, the last value calculation formula, the analysis range period calculation formula, the approximate linear slope calculation formula, the linear regression intercept calculation formula, and the correlation coefficient calculation formula as calculation formulas that can be used in setting the predetermined analyzing conditions, the predetermined analyzing conditions can be efficiently set.

The first aspect of the present invention can provide a method of checking a substrate processing apparatus, wherein the analyzing apparatus stores a plurality of extracting conditions and a plurality of analyzing conditions.

According to the first aspect of the present invention, because the analyzing apparatus stores a plurality of extracting conditions and a plurality of analyzing conditions, the operator can select desired extracting conditions and desired analyzing conditions from the stored plurality of extracting conditions and plurality of analyzing conditions, and as a result, the predetermined extracting conditions and the predetermined analyzing conditions can be more efficiently set.

The first aspect of the present invention can provide a method of checking a substrate processing apparatus, which is executed at a time of acceptance inspection of the substrate processing apparatus.

According to the first aspect of the present invention, because the checking method is executed at the time of acceptance inspection of the substrate processing apparatus, the performance of the substrate processing apparatus delivered to and assembled by a customer and the as-manufactured performance of the substrate processing apparatus, such as transient response characteristics, can be easily and accurately compared with each other, and as a result, the added value of the substrate processing apparatus can be increased.

The first aspect of the present invention can provide a method of checking a substrate processing apparatus, which is executed after the substrate processing apparatus is operated for a predetermined time period.

According to the first aspect of the present invention, because the checking method is executed after the substrate processing apparatus is operated for a predetermined time period, the performance of the substrate processing apparatus delivered to and assembled by the customer and the performance of the substrate processing apparatus after the operation thereof for the predetermined time period, such as transient response characteristics, can be easily and accurately compared with each other, and as a result, it can be easily and accurately determined whether or not it is necessary to carry out the maintenance of the substrate processing apparatus.

Accordingly, the second aspect of the present invention can provide a computer-readable storage medium that stores a program for causing a computer to execute a method of checking a substrate processing apparatus in a system comprising at least one substrate processing apparatus and an analyzing apparatus that reads and analyzes process data comprising time-series data on a plurality of parameters relating to a process comprising a plurality of steps carried out on a substrate by the substrate processing apparatus, the method comprising a data extracting step in which the analyzing apparatus extracts data that satisfies predetermined extracting conditions from the process data, and a data analyzing step in which the analyzing apparatus analyzes the extracted data based on predetermined analyzing conditions.

The features and advantages of the invention will become more apparent from the following detailed description taken in conjunction with the accompanying drawings.

BRIEF DESCRIPTION OF THE DRAWINGS

FIG. 5 is a view showing a starting point condition editing screen displayed on the display shown in FIG. 1;

FIG. 7 is a view showing an analysis result that is output in a step S71 in FIG. 6.

DETAILED DESCRIPTION OF THE PREFERRED EMBODIMENTS

A preferred embodiment of the present invention will be described in detail below with reference to the drawings.

First, a description will be given of an apparatus checking system to which a substrate processing apparatus checking method according to the embodiment is applied.

Figure 1:
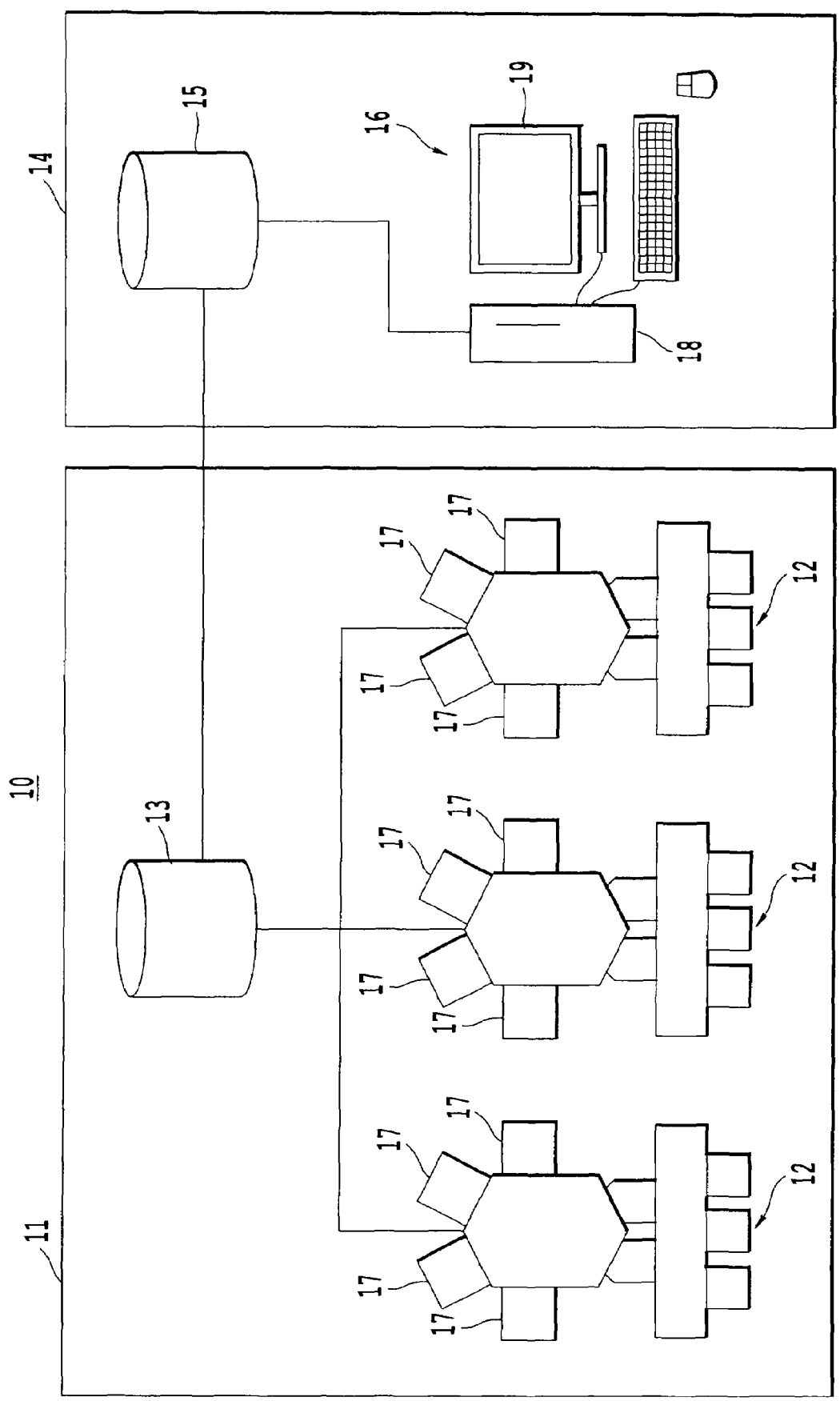
FIG. 1 is a schematic view showing the construction of an apparatus checking system to which a substrate processing apparatus checking method according to an embodiment of the present invention is applied.

FIG. 1 is a schematic view showing the construction of the apparatus checking system to which the substrate processing apparatus checking method according to the embodiment is applied.

Referring to FIG. 1, the apparatus checking system 10 is comprised of a plurality of substrate processing apparatuses 12 disposed in plants and others of an apparatus using company 11 (customer), a customer's server 13 connected to the substrate processing apparatuses 12, a manufacturer's server 15 (data storage apparatus) disposed at a plant, a development block, or the like of an apparatus manufacturing company 14 (manufacturer), and a PC (Personal Computer) 16 (analyzing apparatus) connected to the manufacturer's server 15. In the apparatus checking system 10, the customer's server 13 and the manufacturer's server 15 are connected to each other.

Each of the substrate processing apparatuses 12 has a plurality of process modules 17 that carry out plasma processing such as etching processing or CVD processing on wafers as substrates. Each of the process modules 17 has a chamber, not shown, and upper and lower electrodes, not shown, disposed in the chamber, introduces a process gas into a space between the upper and lower electrodes, applies radio frequency voltage to the space to produce plasma, and carries out plasma processing comprised of a plurality of steps on a wafer mounted on the lower electrode using the plasma.

Each of the component elements (e.g. the upper electrode and the lower electrode) of the process module 17 is equipped with various sensors, and each of the sensors samples values of parameters relating to the plasma processing at intervals of, for example, 100 msec and outputs the sampled values of the parameters as time-series data. The process module 17 transmits the output time-series data to the customer's server 13, and the customer's server 13 stores the transmitted time-series data.

The manufacturer's server 15 accesses the customer's server 13 to extract time-series data on parameters, which is considered useful for checking of the substrate processing apparatus 12, as process data from the time-series data stored in the customer's server 13 and stores the extracted time-series data as the process data. The manufacturer's server 15 also stores event data, described later.

The PC 16 has a main body 18 that accommodates a memory, a CPU, a ROM, and a RAM, all of which are not shown, and a display 19 (display unit) that displays various GUIs and others. The ROM stores a program for executing the checking method according to the present embodiment. The program is loaded into the RAM, and the CPU carries out an analyzing process, described later, or the like in accordance with the program. Also, the memory stores condition groups such as extracting conditions and analyzing conditions, described later.

Figure 2:
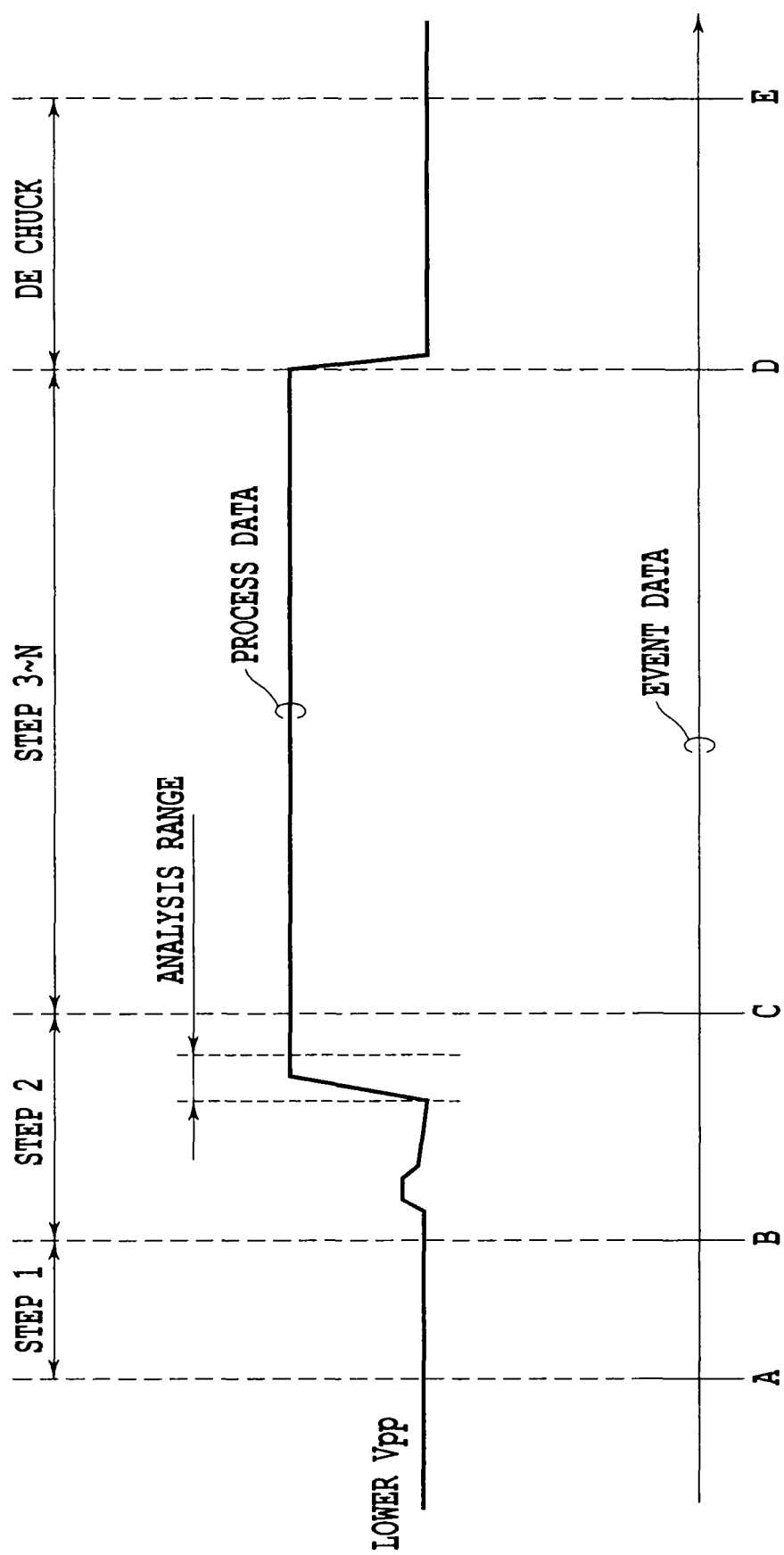
FIG. 2 is a graph showing the relationship between process data and event data stored in a manufacturer's server shown in FIG. 1.

FIG. 2 is a graph showing the relationship between the process data and the event data stored in the manufacturer's server shown in FIG. 1. In FIG. 2, the abscissa indicates time, and the ordinate indicates values of parameters relating to the plasma processing.

As shown in FIG. 2, the event data is time-series data having timings corresponding to starting points and ending points of respective steps (Step 1, Step 2, Step 3-N, and De Chuck) as events (A, B, C, D, and E), and the events correspond to operation starting timing, operation ending timing, etc. of the component elements of the process module 17. The process data (applied voltage values of the lower electrode in FIG. 2) is also time-series data as described above. Therefore, the event data and the process data can be compared with each other. In the present embodiment, the process data is divided into data corresponding to the respective steps based on the event data.

Also, in the present embodiment, in order to clarify fluctuations in parameter values (applied voltage values of the lower electrode in FIG. 2) by decreasing data to be checked, data is further extracted from the data divided according to the steps (hereinafter referred to as "step data"). In FIG. 2, a range in which the applied voltage value of the lower electrode suddenly increases is set as an extraction range (hereinafter referred to as "analysis range") for data. For this analysis range, an operator of the apparatus checking system 10 sets extracting conditions (predetermined extracting conditions) for data corresponding to the analysis range via a condition setting screen 20, described below, as a GUI displayed on the display 19 of the PC 16.

Further, in the present embodiment, not only the above described extracting conditions but also analyzing conditions (predetermined analyzing conditions) for the extracted data are set via the condition setting screen 20. The set extracting conditions and analyzing conditions are stored as condition groups in the memory.

Figure 3A:
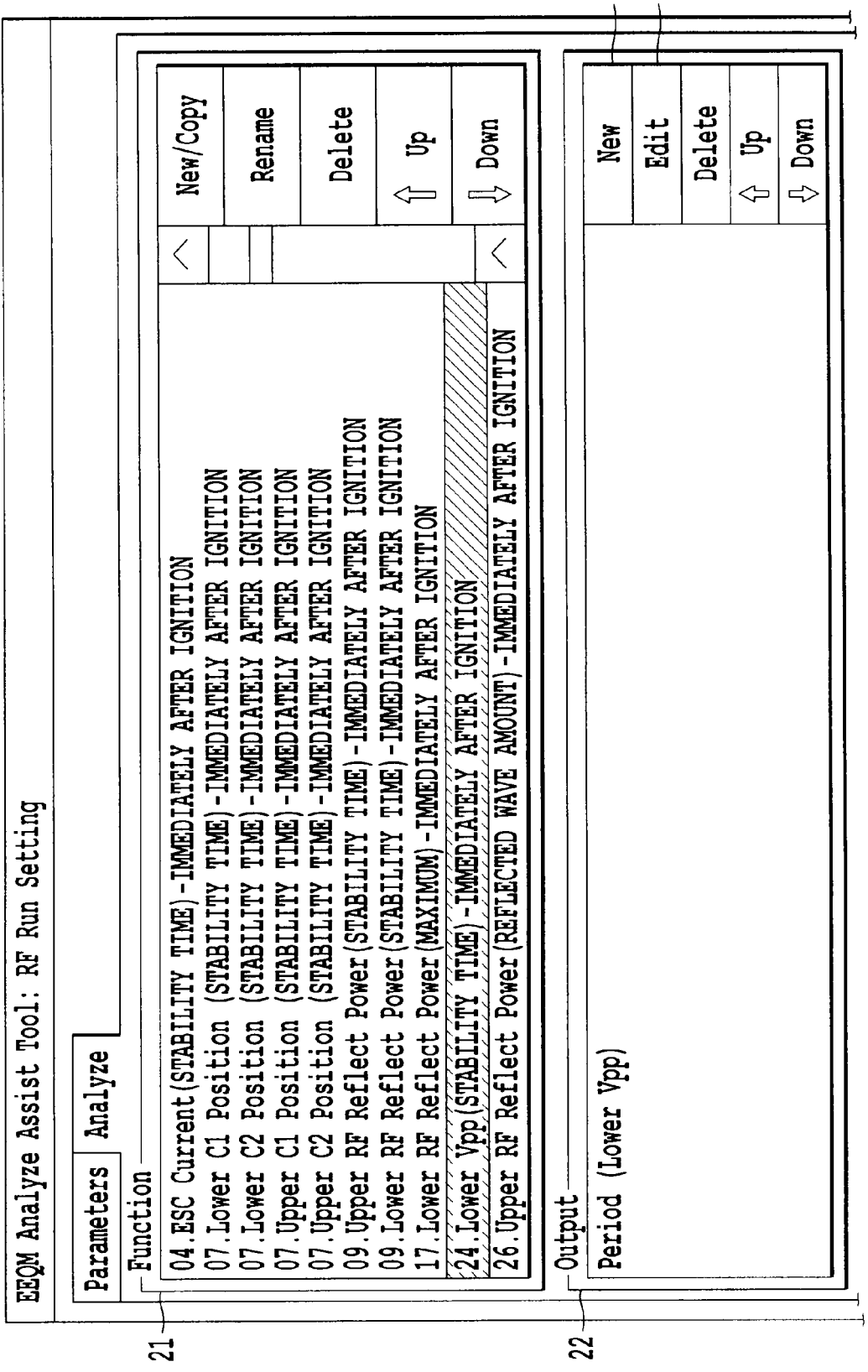
FIG. 3 is a view showing a condition setting screen displayed on a display shown in FIG. 1.

FIG. 3 is a view showing the condition setting screen displayed on the display in FIG. 1.

Referring to FIG. 3, the condition setting screen 20 is comprised of a condition group display section 21 where the condition groups stored in the memory are displayed in a list form (a field designated as "Function" in the drawing), an analyzing condition display section 22 where analyzing conditions are displayed (a field designated as "Output" in the drawing), and an extracting condition display section 23 where extracting conditions are displayed (a field designated as "Extract conditions" in the drawing).

In the condition group display section 21, each of the condition groups, for example, "24. Lower Vpp (stability time)—immediately after ignition)" can be edited, added, and deleted by depressing displayed buttons. Also, by selecting any condition group in the condition group list using a pointing device or the like, extracting conditions and analyzing conditions of the selected condition group are displayed in the analyzing condition display selection 22 and the extracting condition display section 23, respectively.

Figure 4:
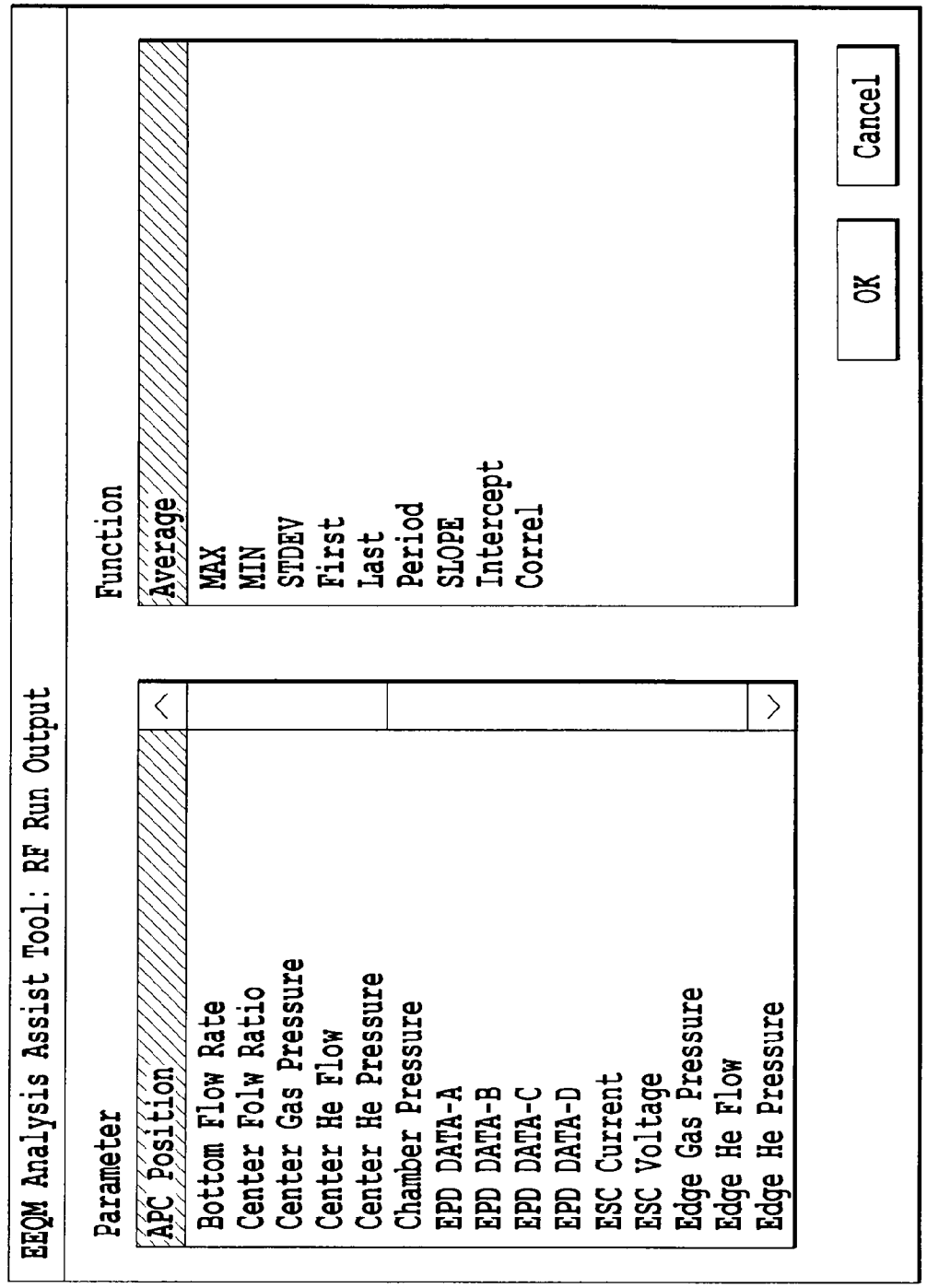
FIG. 4 is a view showing an analysis condition editing screen displayed on the display shown in FIG. 1.

In the analyzing condition display section 22, analyzing conditions can be edited, added, and deleted by depressing displayed buttons. In editing or adding any analyzing condition, a "New" button 22a or an "Edit" button 22b displayed in the analyzing condition display section 22 is depressed. In response to the depression, an analyzing condition editing screen 24 (shown in FIG. 4) as a GUI is displayed on the display 19.

In the analyzing condition editing screen 24, parameters to be analyzed and the contents of analysis to be performed on data of the parameters can be set. The parameters (for example, "APC Position") that can be analyzed are displayed in a list form. The parameters correspond to parameters extracted from the customer's server 13 by the manufacturer's server 15. Also, formulas that can be used in setting the contents of analysis are displayed in a list form. Specifically, an average calculation ("Average") formula, a maximum value calculation ("MAX") formula, a minimum value calculation ("MIN") formula, a standard deviation calculation ("STDEV") formula, a first value ("First") formula, a last value ("Last") formula, an analysis range period calculation ("Period") formula, an approximate linear slope calculation ("SLOPE") formula, a linear regression intercept calculation ("Intercept") formula, and a correlation coefficient calculation ("Correl") formula are displayed. The operator sets analyzing conditions (parameters and the contents of analysis) by selecting a desired parameter and formula using a pointing device or the like.

The extracting condition display section 23 is comprised of a step designating section 25 where step data including an analysis range (hereinafter referred to as "step data to be analyzed") is designated, and a starting point setting section 26 and an ending point setting section 27 where conditions that should be satisfied by the starting point and the ending point of the analysis range are set.

In the step designating section 25, step data including an analysis range can be designated via a pull-down menu 25a and a numerical value input field 25b. In the designated step data, extraction of data and analysis of the analysis range are carried out for all the condition groups displayed in a list form in the condition group display section 21.

In the starting point setting section 26, conditions that should be satisfied by the starting point of an analysis range (hereinafter referred to as "starting point conditions") can be edited and deleted by depressing displayed buttons. In editing or deleting starting point conditions, an "Edit" button 26a or a "Delete" button 26b displayed in the starting point setting section 26 is depressed. In response to the depression, a starting point condition editing screen 28 (shown in FIG. 5) as a GUI is displayed on the display 19.

In the starting point condition editing screen 28, conditional expressions used for starting point conditions and variables used for the conditional expressions can be set. As a rule, the conditional expressions used for the starting point conditions are relational expressions of a variable "V" and a threshold value "x". The conditional expressions that can be used are displayed in a list form in a conditional expression display section 29. The operator can select a desired conditional expression using a pointing device or the like.

The conditional expression display section 29 is comprised of an offset value input field 29a where a time lag (offset value) from a time point at which set starting point conditions are satisfied can be set, a filter value input field 29b where the number of times that set starting conditions are satisfied can be set, and a threshold value input field 29c where the value of the threshold value "x" can be input and set. In particular, if the number of times is input to the filter value input field 29b, timing in process data at that time point is output when the number of times of satisfaction of a conditional expression has exceeded the input number of times.

Also, the variable "V" in a conditional expression can be set in a variable setting section 30. The variable "V" is defied by parameters in process data and calculation formulas. In the present embodiment, the number of calculation formulas used for calculation of the variable "V" is set to three at the maximum. Parameters that can be used for definition of the variable "V" are displayed in a list form, and a desired parameter can be selected using a pointing device or the like. Also, calculation formulas used for calculation of the variable "V" can be set via a pull-down menu 30a and a numeric value input field 30b. It should be noted that calculation formulas provided by the pull-down menu 30a are a difference calculation formula, an absolute value calculation formula, a moving average calculation formula, and so on.

In the ending point setting section 27, conditions that should be satisfied by the ending point of an analysis range (hereinafter referred to as "ending point conditions") can be edited and deleted by depressing displayed buttons. In editing or deleting ending point conditions, an "Edit" button 27a or a "Delete" button 27b displayed in the ending point setting section 27 is depressed. In response to the depression, an ending point condition editing screen similar to the starting point condition editing screen 28, not shown, is displayed on the display 19. The operator can set conditional expressions used for ending point conditions, and variables used in the conditional expressions.

Further, the operator can set a plurality of conditional expressions used in starting point conditions and ending point conditions, and the starting point setting section 26 and the ending point setting section 27 have conditional expression combination fields 26c and 27c, respectively. In these conditional expression combination fields 26c and 27c, the relationship between a plurality of conditional expressions to be combined (for example, "and/or") is defined.

In an analyzing process, described later, timing (time) in process data at time points at which set starting point conditions and ending point conditions are satisfied is output.

Moreover, in the PC 16, a plurality of condition groups that are set via the above described condition group display section 21, analyzing condition editing screen 24, and starting point condition editing screen 28 are stored in the memory.

Next, a description will be given of the substrate processing apparatus checking method according to the embodiment of the present invention.

Figure 6:
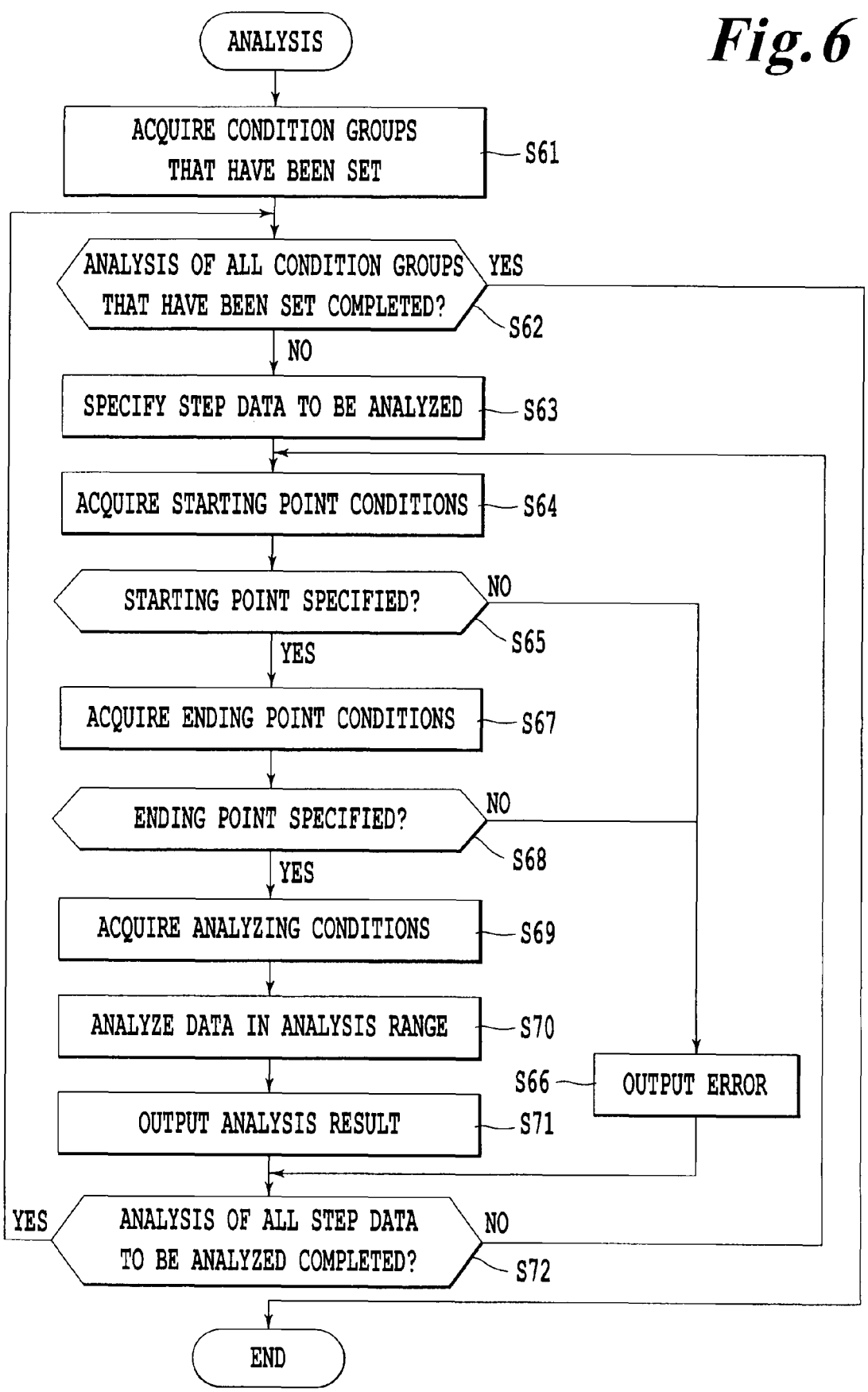
FIG. 6 is a flow chart showing an analyzing process carried out as a part of the substrate processing apparatus checking method according to the embodiment.

FIG. 6 is a flow chart of the analyzing process that is carried out as part of the substrate processing apparatus checking method according to the present embodiment. The process in FIG. 6 is carried out by the CPU of the PC 16 when the CPU downloads process data stored in the manufacturer's server 15 after condition groups are set in the condition group display section 21 and others described above. At this time, the PC 16 downloads process data on a plurality of wafers (in the present embodiment, 25 wafers corresponding to one lot).

In downloading the process data, the CPU divides the process data to be downloaded into step data based on event data stored in the manufacturer's server 15 (data dividing step) prior to the process in FIG. 6. At this time, a plurality of pieces of process data corresponding to a plurality of wafers are downloaded, and all the pieces of process data are divided into step data. It should be noted that the process in FIG. 6 and the division of process data into step data correspond to the substrate processing apparatus checking method according to the present embodiment.

Referring to FIG. 6, first, all of condition groups set in the condition group display section 21 are obtained (step S61).

Next, it is determined whether or not extraction and analysis of analysis ranges for data corresponding to all the obtained condition groups have been completed (step S62). If the analysis and the like for all the condition groups have been completed, the present process is brought to an end, and if the analysis and the like for all the condition groups have not been completed, one condition group for which the analysis and the like have not been completed is selected from all the obtained condition groups, and further, step data to be analyzed designated via the step designating section 25 is specified from the step data obtained by dividing the process data (step S63). This specifying process is carried out for each piece of the process data on the respective wafers, and as a result, 25 pieces of step data to be analyzed are specified.

Next, one piece of step data to be analyzed, for which the analysis and the like have not been completed, is selected from the specified 25 pieces of step data to be analyzed, and further, starting point conditions in extracting conditions for the selected condition group, which have been set via the starting point setting section 26 and the starting point condition editing screen 28, are obtained (step S64).

In the next step S65, it is determined whether or not it is possible to specify the starting point of an analysis range in the selected step data to be analyzed, and if not possible, an error signal is output, and an error message is displayed on the display 19 (step S66). Then, the process proceeds to a step S72. If the starting point can be specified in the step S65, timing at the time point at which the starting point conditions are satisfied (hereinafter referred to as "starting point timing") is output.

Next, ending point conditions in the extracting conditions for the selected condition group, which have been set via the ending point setting section 27 and the ending point condition editing screen, are obtained (step S67).

In the next step S68, it is determined whether or not it is possible to specify the ending point of the analysis range in the selected step data to be analyzed, and if not possible, an error signal is output, and an error message is displayed on the display 19 (step S66). Then, the process proceeds to the step S72. If the ending point can be specified in the step S68, timing at the time point at which the ending point conditions are satisfied (hereinafter referred to as "ending point timing") is output.

Next, data in the analysis range is extracted from the selected step data to be analyzed based on the output starting point timing and ending point timing (data extracting step), and further, analyzing conditions for the selected condition group are obtained (step S69).

Next, the extracted data in the analysis range is analyzed based on the analyzing conditions (data extracting step) (step S70), and the analysis result is output (step S71).

FIG. 7 is a view showing the analysis result that is output in the step S71 in FIG. 6.

Referring to FIG. 7, data in rows is the analysis result that is output in the step S71, and the analysis result includes names of selected condition groups ("Function name" in the drawing), step numbers corresponding to selected step data to be analyzed, starting point timing ("First time" in the drawing), ending point timing ("Last time" in the drawing), parameters in obtained analyzing conditions and analysis contents ("Parameter name" in the drawing), analysis values, and so on.

Referring again to FIG. 6, in the next step S72, it is determined whether or not the analysis and the like corresponding to the analysis conditions for the selected condition group in 25 (all) pieces of step data to be analyzed has been completed, and if the analysis and the like of 25 pieces of step data to be analyzed has not been completed, the process returns to the step S64, in which the analysis and the like of other step data to be analyzed is carried out based on the same condition group.

Also, if it is determined in the step S72 that the analysis of 25 pieces of step data to be analyzed has been completed, the process returns to the step S62, in which the analysis and the like for another condition group, or the present process is brought to an end.

According to the substrate processing apparatus checking method of the present embodiment, because the CPU of the PC 16 extracts data in an analysis range that satisfies extracting conditions (starting point conditions and ending point conditions) of a condition group that has been set via the condition group display section 21 from step data to be analyzed which has been divided from process data, and further, because the CPU analyzes the data in the analysis range based on the analysis conditions of the set condition group, it is unnecessary for the operator to manually extract the data in the analysis range and analyze the data in the analysis range. Moreover, the effects of the data in the analysis range are mainly reflected on the result of analysis on the data in the analysis range, and hence, if data relating to transient response characteristics is extracted as the data in the analysis range, the transient response characteristics of the substrate processing apparatus 12 can be easily and reliably checked.

According to the substrate processing apparatus checking method described above, because process data is divided into step data based on event data prior to the extraction of data in an analysis range, data to be extracted in the analysis range can be decreased, and hence the transient response characteristics of the substrate processing apparatus 12 can be checked more easily.

Further, according to the substrate processing apparatus checking method described above, because the division of process data into step data, the extraction of data in an analysis range, and the analysis of data in the analysis range are carried out when the CPU of the PC 16 downloads the process data from the manufacturer's server 15, the operator can use the result of the analysis of the process data immediately after the CPU downloads the process data, and as a result, the checking efficiency can be improved.

Further, according to the substrate processing apparatus checking method described above, because extracting conditions and analyzing conditions in set condition groups are set before the CPU downloads process data, the extraction of data in an analysis range and the analysis of data in the analysis range can be carried out immediately after the process data is downloaded, and as a result, the checking efficiency can be further improved.

Further, in the apparatus checking system 10 to which the substrate processing apparatus checking method of the present embodiment is applied, because the manufacturer's server 15 stores process data and event data, the event data can be immediately referred to when the process data is divided into step data, and thus the process data can be smoothly divided into the step data.

In the apparatus checking system 10 described above, because extracting conditions and analyzing conditions in each condition group are set via the condition setting screen 20 (the condition group display section 21, the analyzing condition editing screen 24, the starting point condition editing screen 28, and the ending point condition editing screen) as a GUI, the extracting conditions and the analyzing conditions in each condition group can be easily set, and as a result, the checking efficiency can be further improved.

Moreover, in the apparatus checking system 10 described above, because the conditional expression display section 29 of the starting point condition editing screen 28 and the conditional expression display section of the ending point condition editing screen, not shown, provide the difference calculation formula, the absolute calculation formula, and the moving-average calculation formula as calculation formulas that can be used in setting starting point conditions and ending point conditions, the starting point conditions and the ending point conditions can be efficiently set.

Further, in the apparatus checking system 10 described above, because the analyzing condition editing screen 24 provides the average calculation formula, the maximum value calculation formula, the minimum value calculation formula, the standard deviation calculation formula, the first value calculation formula, the last value calculation formula, the analysis range period calculation formula, the approximate linear slope calculation formula, the linear regression intercept calculation formula, and the correlation coefficient calculation formula as calculation formulas that can be used in setting the contents of analysis in analyzing conditions, and thus the contents of analysis can be efficiently set.

Further, in the apparatus checking system 10 described above, because the memory of the PC 16 stores a plurality of condition groups, the operator can select a desired condition group from the stored plurality of condition groups, and as a result, condition groups can be set more efficiently.

Although in the above described embodiment, timing for carrying out the process in FIG. 6 is not particularly limited, it is preferred that the process in FIG. 6 is carried out at the time of acceptance inspection of the substrate processing apparatus 12 by the customer. In this case, the process in FIG. 6 is carried out once by the apparatus manufacturing company so as to check as-manufacture performance prior to the delivery of the substrate processing apparatus 12 to the customer. As a result, the performance of the substrate processing apparatus 12 delivered to and assembled by the customer and the as-manufactured performance of the substrate processing apparatus 12, such as transient response characteristics, can be easily and accurately compared with each other, and thus, the added value of the substrate processing apparatus 12 can be increased.

Further, the process in FIG. 6 may be carried out after the substrate processing apparatus 12 is operated for a predetermined time period, and in this case, the performance of the substrate processing apparatus 12 delivered to the customer and assembled and the performance of the substrate processing apparatus 12 after the operation thereof for the predetermined time period, such as transient response characteristics, can be easily and accurately compared with each other, and as a result, it can be easily and accurately determined whether or not it is necessary to carry out the maintenance of the substrate processing apparatus 12.

Although in the above described process in FIG. 6, only the output of an analysis result is carried out, a threshold value may be provided for the analysis result, and whether or not the substrate processing apparatus 12 is normal may be determined based on comparison with the threshold value.

Although in the above described process in FIG. 6, the result of analysis of downloaded process data on all the wafers is output, the result of analysis of process data on all the wafers in one lot is not always required in checking the substrate processing apparatus 12. Thus, the result of analysis of process data on only desired wafers may be output, so that the substrate processing apparatus 12 can be efficiently checked.

Moreover, it is to be understood that the object of the present invention may also be accomplished by supplying a computer with a storage medium in which a program code of software, which realizes the functions of the above described embodiment is stored, and causing a CPU of the computer to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program may be supplied by downloading from another computer, a database, or the like, not shown, connected to the Internet, a commercial network, a local area network, or the like.

Further, it is to be understood that the functions of the above described embodiment may be accomplished not only by executing a program code read out by a computer, but also by causing an OS (operating system) or the like which operates on a CPU to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program executed by an interpreter, or script data supplied to an OS.

What is claimed is:

1. A method of checking a substrate processing apparatus in a system comprising at least one substrate processing apparatus and an analyzing apparatus that reads and analyzes process data comprising time-series data on a plurality of parameters relating to a process comprising a plurality of steps carried out on substrates by the substrate processing apparatus, comprising:

a process data dividing step in which the analyzing apparatus divides the process data for each substrate of the substrates into a plurality of step data corresponding to respective steps of the plurality of steps carried out on a respective substrate by the substrate processing apparatus based on event data indicative of starting points and ending points of the plurality of steps carried out in the process for the respective substrate;

a first data extracting step in which the analyzing apparatus specifies and extracts, for one substrate of the substrates, step data to be analyzed from the plurality of step data divided in said process data dividing step;

a second data extracting step in which the analyzing apparatus further specifies and extracts, from the specified and extracted step data for the one substrate, analysis range data, which is time-series data of a part of the specified and extracted step data specified and extracted in said first data extracting step and which satisfies predetermined extracting conditions; and a data analyzing step in which the analyzing apparatus analyzes the analysis range data specified and extracted in said second extracting step for the one substrate based on predetermined analyzing conditions.

2. A method of checking a substrate processing apparatus as claimed in claim 1, wherein the system further comprises a data storage apparatus, and the data storage apparatus stores the process data and the event data.

3. A method of checking a substrate processing apparatus as claimed in claim 1, wherein the analyzing apparatus carries out, in series, said data dividing step, said data extracting step, and said data analyzing step in reading the process data from a data storage apparatus.

4. A method of checking a substrate processing apparatus as claimed in claim 3, wherein the predetermined extracting conditions and the predetermined analyzing conditions are set before the process data is read by the analyzing apparatus.

5. A method of checking a substrate processing apparatus as claimed in claim 1, wherein the analyzing apparatus comprises a display section displaying a GUI (Graphic User Interface), and the predetermined extracting conditions and the predetermined analyzing conditions are set via the GUI.

6. A method of checking a substrate processing apparatus as claimed in claim 5, wherein the GUI provides at least a difference calculation formula, an absolute value calculation formula, and a moving average calculation formula as calculation formulas that can be used in setting the predetermined extracting conditions.

7. A method of checking a substrate processing apparatus as claimed in claim 5, wherein the GUI provides at least an average calculation formula, a maximum value calculation formula, a minimum value calculation formula, a standard deviation calculation formula, a first value calculation formula, a last value calculation formula, an analysis range period calculation formula, an approximate linear slope calculation formula, a linear regression intercept calculation formula, and a correlation coefficient calculation formula as calculation formulas that can be used in setting the predetermined analyzing conditions.

8. A method of checking a substrate processing apparatus as claimed in claim 1, wherein the analyzing apparatus stores a plurality of extracting conditions and a plurality of analyzing conditions.

9. A method of checking a substrate processing apparatus as claimed in claim 1, which is executed when a client accepts the substrate processing apparatus.

10. A method of checking a substrate processing apparatus as claimed in claim 1, which is executed after the substrate processing apparatus is operated for a predetermined time period.

11. A method of checking a substrate processing apparatus as claimed in claim 1, wherein a time lag from a time point at which analysis of the extracted data is started is set.

12. A method of checking a substrate processing apparatus as claimed in claim 1, wherein a number of times that should be satisfied by a starting point of the extracted data in said data analyzing step is set.

13. A non-transitory computer-readable storage medium that stores a program for causing a computer to execute a method of checking a substrate processing apparatus in a system comprising at least one substrate processing apparatus and an analyzing apparatus that reads and analyzes process data comprising time-series data on a plurality of parameters relating to a process comprising a plurality of steps carried out on substrates by the substrate processing apparatus, the method comprising:

a process data dividing step in which the analyzing apparatus divides the process data for each substrate of the substrates into a plurality of step data corresponding to respective steps of the plurality of steps carried out on a respective substrate by the substrate processing apparatus based on event data indicative of starting points and ending points of the plurality of steps carried out in the process for the respective substrate;

a first data extracting step in which the analyzing apparatus specifies and extracts, for one substrate of the substrates, step data to be analyzed from the plurality of step data divided in said process data dividing step;

a second data extracting step in which the analyzing apparatus further specifies and extracts, from the specified and extracted step data for the one substrate, analysis range data, which is time-series data of a part of the specified and extracted step data specified and extracted in said first data extracting step and which satisfies predetermined extracting conditions; and a data analyzing step in which the analyzing apparatus analyzes the analysis range data specified and extracted in said second extracting step for the one substrate based on predetermined analyzing conditions.

* * * * *